(12) United States Patent
Park et al.

(10) Patent No.: US 7,845,064 B2
(45) Date of Patent: Dec. 7, 2010

(54) METHOD FOR MANUFACTURING CRYSTAL DEVICE

(75) Inventors: Jang Ho Park, Gyunggi-Do (KR); Tae Hoon Kim, Gyunggi-Do (KR); Jong Yeol Jeon, Gyunggi-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 181 days.

(21) Appl. No.: 12/171,106

(22) Filed: Jul. 10, 2008

(65) Prior Publication Data

US 2009/0013519 A1 Jan. 15, 2009

(30) Foreign Application Priority Data

Jul. 11, 2007 (KR) ...................... 10-2007-0069563

(51) Int. Cl.
*H04R 31/00* (2006.01)
(52) U.S. Cl. ..................... 29/594; 29/25.35; 29/595; 29/609.1; 216/13; 216/80; 216/97; 310/319; 310/370; 331/158; 331/176
(58) Field of Classification Search ............ 29/25.35, 29/594, 595, 609.1; 216/13, 80, 97; 310/319, 310/370; 331/158, 176
See application file for complete search history.

(56) References Cited

U.S. PATENT DOCUMENTS

| | | | |
|---|---|---|---|
| 4,652,787 A * | 3/1987 | Zingg | 310/344 |
| 5,235,237 A * | 8/1993 | Leonhardt | 310/329 |
| 5,747,857 A | 5/1998 | Eda et al. | |
| 6,924,429 B2 | 8/2005 | Kasai et al. | |
| 7,034,441 B2 | 4/2006 | Ono et al. | |
| 7,407,826 B2 * | 8/2008 | Jafri et al. | 438/48 |

FOREIGN PATENT DOCUMENTS

| | | |
|---|---|---|
| DE | 10331322 A1 | 2/2005 |
| JP | 02010907 A * | 1/1990 |
| JP | 2005051495 A | 2/2005 |
| WO | 2005041250 A2 | 5/2005 |

OTHER PUBLICATIONS

German OA corresponding to German patent application No. 102008032233.4., mailed Nov. 20, 2009.

* cited by examiner

*Primary Examiner*—Paul D Kim
(74) *Attorney, Agent, or Firm*—Lowe, Hauptman, Ham & Berner, LLP

(57) ABSTRACT

A control apparatus and method for controlling an image display includes at least one reference object for generating a predetermined spectrum signal, a modulation unit for modulating the predetermined spectrum signal with a predetermined method, and a remote controller. The remote controller includes an image sensor for receiving the modulated predetermined spectrum signal and generating a digital signal and a processing unit for receiving the digital signal, demodulating the digital signal, and calculating an image variation of the image of the reference object formed on the digital image.

9 Claims, 4 Drawing Sheets

METHOD FOR MANUFACTURING CRYSTAL DEVICE

CROSS-REFERENCE TO RELATED APPLICATIONS

This application claims the priority of Korean Patent Application No. 2007-69563 filed on Jul. 11, 2007, in the Korean Intellectual Property Office, the disclosure of which is incorporated herein by reference.

BACKGROUND OF THE INVENTION

1. Field of the Invention

The present invention relates to a method for manufacturing a crystal device, and more particularly, to a method for manufacturing a crystal resonator, which can manufacture a crystal resonator through wafer level packaging.

2. Description of the Related Art

In general, a crystal device is a device in which, when an external voltage is applied thereto, a crystal blank in the crystal resonator oscillates due to a piezoelectric effect and thus generates a frequency through the oscillation. The crystal resonator allows for a stable frequency and thus is utilized in an oscillation circuit of, e.g., a computer or a communication device. Also, this crystal resonator, when upgraded to, e.g., a voltage controlled crystal oscillator (VCXO), a temperature compensated crystal oscillator (TCXO), an oven controlled crystal oscillator (OCXO), enables a frequency to be adjusted more precisely. For this reason, the crystal resonator used as a core component providing a reference for every signal.

Recently, a mobile communication terminal such as a mobile phone is diversified and complicated in function, accordingly requiring components thereof to be smaller and thinner.

However, the related art process for manufacturing the crystal oscillator has limitations in miniaturizing a package product, i.e., a final product.

SUMMARY OF THE INVENTION

An aspect of the present invention provides a method for manufacturing a crystal device or resonator which can achieve high reliability by bonding wafers of different materials, allow a small size and a thin profile of a product by reducing a product size and thickness, facilitate mass production thereof, and improve a process lead time and process efficiency.

According to an aspect of the present invention, there is provided a method for manufacturing a crystal resonator, including: providing a package wafer including a plurality of internal and external connection terminals each having top and bottom ends respectively exposed to top and bottom surfaces of the package wafer; forming a height control member on the top end of the internal and external connection terminal and bonding one end of a crystal blank including an excitation electrode on the height control member; placing a bottom surface of a cap wafer having a cavity, which is open downward, on the top surface of the package wafer to which the crystal blank is mounted, and anodically bonding the package wafer with the cap wafer; and cutting the package wafer and the cap wafer in a direction across a bonding line formed by the bonding of the package wafer and the cap wafer to provide a plurality of crystal resonators that are individually separated.

The providing the package wafer may include: forming a first pattern mask on the bottom surface of the package wafer and etching the bottom surface of the package wafer to form a plurality of blind via holes; forming a second pattern mask surrounding the blind via holes, and applying a conductive metal layer in the blind via hole and the bottom surface of the wafer; and polishing the top surface of the package wafer to expose a top end of each blind via hole outward.

The applying a conductive metal layer may include filling a conductive filler in an inner space of each blind via hole.

The forming a height control member may include: forming a third pattern mask exposing the top end of the internal and external connection terminal on the top surface of the package wafer, and exposing, to light, the top end of the internal and external connection terminal exposed by the third mask pattern to form a plating pattern; forming a first metal layer of a predetermined thickness on the plating pattern; and forming a second metal layer of a predetermined thickness on the first metal layer.

The bonding one end of a crystal blank may include applying conductive paste on a top end of the height control member.

The height control member and the crystal blank may be bonded with each other by an ultrasonic method.

The excitation electrode formed on the top surface of the crystal blank may be partially removed by dry-etching to adjust a frequency of the crystal blank.

The method for manufacturing a crystal resonator may further include polishing a top surface of the cap wafer to reduce a thickness of the cap wafer after the cavity is formed in the cap wafer.

The method for manufacturing a crystal resonator may further include polishing a top surface of the cap wafer to reduce a thickness of the cap wafer after the package wafer and the cap wafer are bonded with each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
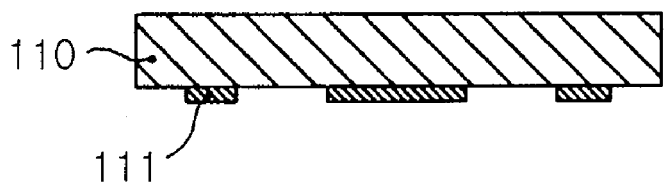
FIGS. 1A through 1J are cross-sectional views illustrating the process flow of mounting a crystal blank to a package wafer in a method for manufacturing a crystal resonator according to an exemplary embodiment of the present invention.

Exemplary embodiments of the present invention will now be described in detail with reference to the accompanying drawings.

FIGS. 1A through 1J are cross-sectional views illustrating the process flow of mounting a crystal blank 130 to a package wafer 110 in a method for manufacturing a crystal resonator 100 according to an exemplary embodiment of the present invention.

The package wafer 110 corresponds to a lower substrate of a desired crystal resonator 100. The package wafer 110 is a disc-shaped substrate formed of a material such as low-cost glass or silicon.

The package wafer 110 includes a plurality of internal and external connection terminals 112 (hereinafter, referred to as connection terminals). The connection terminal 112 is electrically connected to one end of the crystal blank 130 which will be described later. Each of the connection terminals 112 has top and bottom ends exposed to top and bottom surfaces of the package wafer 110, respectively.

As shown in FIG. 1A, to form the plurality of connection terminals 112 in the package wafer 110, a first pattern mask 111 is patterned on the bottom surface of the package wafer 110.

Figure 1B:
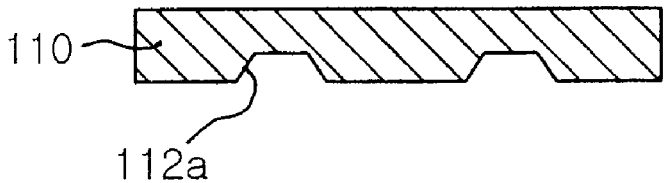

As shown in FIG. 1B, the bottom surface of the package wafer 110 is etched by dry-etching such as sand blasting or wet-etching using an etching solution, thereby forming a plurality of blind via holes 112a in a predetermined depth. Each of the blind via holes 112 has a closed upper end and an open lower end.

After the blind via holes 122a are formed, a remaining portion of the first pattern mask 11 is removed from the bottom surface of the package wafer 110 by ashing.

Figure 1C:
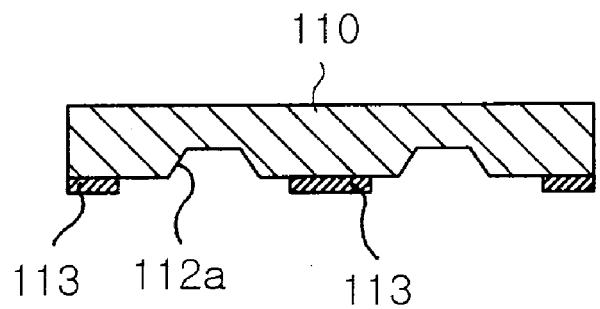

Subsequently, as shown in FIG. 1C, a second pattern mask 113 is patterned on the bottom surface of the package wafer 110, surrounding the blind via holes 112a.

Figure 1D:
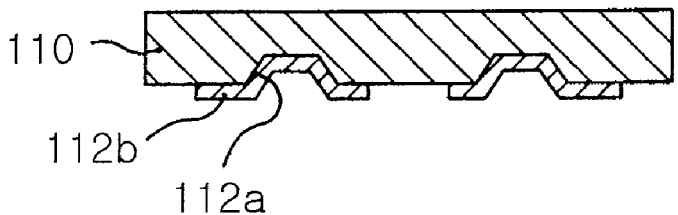

As shown in FIG. 1D, a conductive metal is applied on the bottom surface of the package wafer 110 to form a conductive metal layer 112b of a predetermined thickness on an inner surface of each blind via hole 112a and a portion of the bottom surface of the package wafer 110 where the second mask is not formed.

If the package wafer 110 is formed of silicon, before the conductive metal is applied, an insulating coating layer such as $SiO_2$ or SiN may be applied on the inner surface of the blind via hole 112a and the portion of the bottom surface of the package wafer 110, and thereafter the conductive metal is applied thereon.

After the conductive metal layer 112b is formed, a remaining portion of the semiconductor pattern mask 113 is removed from the bottom surface of the package wafer 110 by ashing.

Figure 1E:
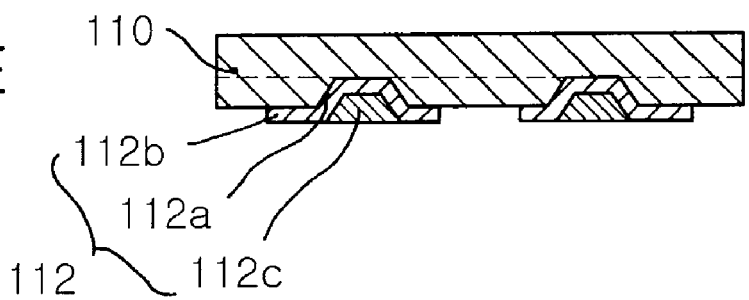

Subsequently, as shown in FIG. 1E, the blind via hole 112a coated with the conductive metal layer 112b of a predetermined thickness is filled with a predetermined amount of conductive filler 112c.

The conductive filler 122c may be filled in the blind via hole 112a such that a bottom surface of the conductive filler 122c is flush with the bottom surface of the package wafer 110 so as to have a step with the metal layer 112b applied on the bottom surface of the package wafer 110. However, the present invention is not limited thereto, and the bottom surface of the conductive filler 122c may be flush with the conductive metal layer 112b.

After the conductive filler 122c is applied in the blind via hole 112a, as shown in FIG. 1E, a top surface of the package wafer 110 is polished to a predetermined thickness indicated by a dotted line in the drawing. Thus, a top end of each connection terminal 112 including the blind via hole 112a coated with the conductive metal layer 112b and filled with the conductive filler 112c is exposed outward.

The top surface of the package wafer 110 may be polished until the conductive metal layer 112b formed on the inner surface of the blind via hole 112a of the connection terminal 112 is exposed upward. However, the present invention is not limited thereto, and the polishing may be performed until the conductive filler 112c applied in the blind via hole 112a is exposed outward together with the conductive metal layer 112b.

Figure 1F:
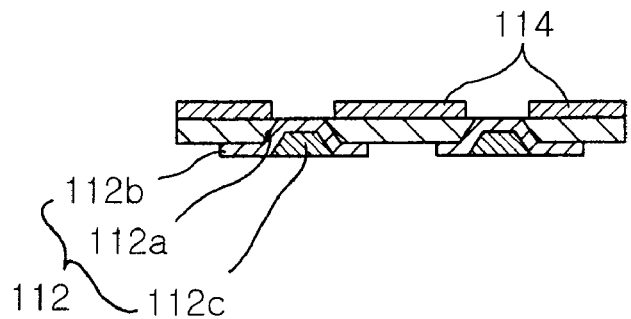
Figure 1G:
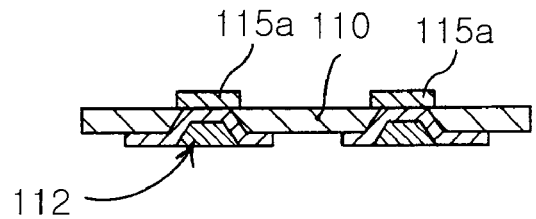
Figure 1H:
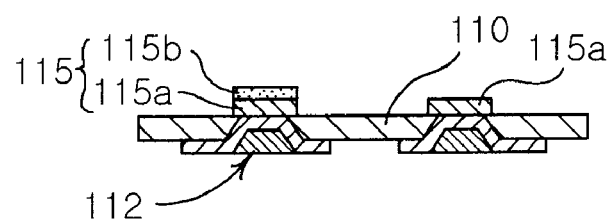

Subsequently, as shown in FIGS. 1F, 3G and 3H, a height control member 115 with a predetermined height is formed on the top end of the connection terminal 112, i.e., on the top surface of the package wafer 110. One end of the crystal blank 130 is mounted on the height control member 115, and the other end of the crystal blank 130 is a free end to oscillate. Since the height control member 115 has a predetermined height, the other end of the crystal blank 130 is prevented from being interrupted by the package wafer 110.

In detail, a third pattern mask 114 exposing the top end of the connection terminal 112 is formed on the top surface of the package wafer 110. Then, a portion of the connection terminal 112 exposed by the third pattern mask 114 is exposed to light to form a plating pattern. Thereafter, a first metal layer 115a of a predetermined thickness is formed on the plating pattern, and a second metal layer 115b of a predetermined thickness is formed on a top surface of the first metal layer 115a, thereby forming the height control member 115 of tens of micrometers.

After the height control member 115 is formed, a remaining portion of the third pattern mask 114 is removed from the top surface of the package wafer 110 by ashing.

The first metal layer 115a may be formed of a Cu material, and the second metal layer 115b may be formed of an Au material.

Figure 1I:
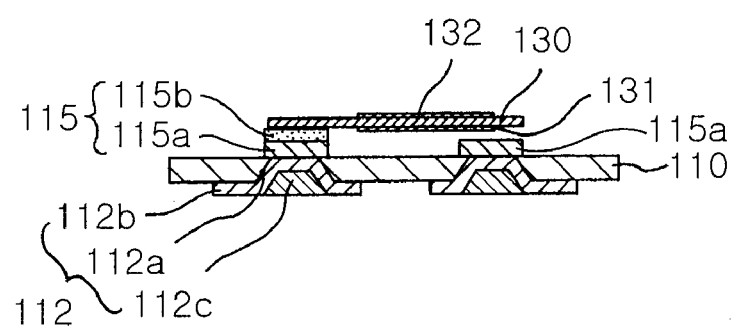

Subsequently, as shown in FIG. 1I, the crystal blank 130 including excitation electrodes 131 and 132 on its respective top and bottom surfaces has one end bonded on the top end of the height control member 115 by ultrasonic fusing, so that the crystal blank 130 is electrically connected with the connection terminal 112. The crystal blank 130 has the other end serving as a free end, and maintains the predetermined height from the top surface of the package wafer 110 by the height control member 115.

Before the one end of the crystal blank 130 is mounted on the height control member 115 by ultrasonic fusing, conductive paste may be applied in order to enhance the ultrasonic bond strength and install the crystal blank 130 at a higher location.

Figure 1J:
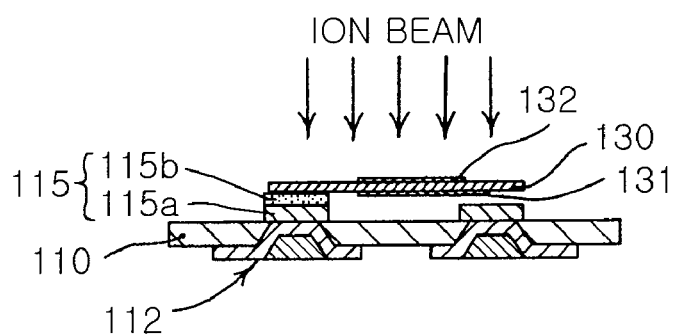

As shown in FIG. 1J, the excitation electrode 132 is exposed upward on the top surface of the crystal blank 130 electrically mounted to the connection terminal 112 with the height control member 115 interposed therebetween. An ion beam is emitted from right above the crystal blank 130 to the excitation electrode 132 formed on the top surface of the crystal blank 130. Thus, dry-etching such as ion-beam etching is performed to remove a portion of the excitation electrode 132, thereby adjusting a frequency of the crystal blank 120.

Power is applied to the excitation electrode 132 of the crystal blank 120 through the connection terminal 112 to cause the crystal blank 120 to oscillate and generate a frequency. Adjustment of the frequency is performed by a probe (not shown) that is disposed under the package wafer 110 and has a front end contacting the connection terminal 112.

FIGS. 2A through 2D are cross-sectional views illustrating the process flow of forming a cavity in a cap wafer 120 in a method for manufacturing a crystal resonator according to an exemplary embodiment of the present invention.

The cap wafer 120 corresponds to an upper substrate of the desired crystal resonator 100. The cap wafer 120 is a disc-shaped substrate formed of a material such as low-cost glass or silicon.

A cavity C is formed in the cap wafer 120 so as to form a closed space for isolating the crystal blank 130 mounted to the package wafer 110 from an external environment when the cap wafer 120 is bonded with the package wafer 110. The cavity C is provided in a bottom surface of the cap wafer 120 and is open downward.

Figure 2A:
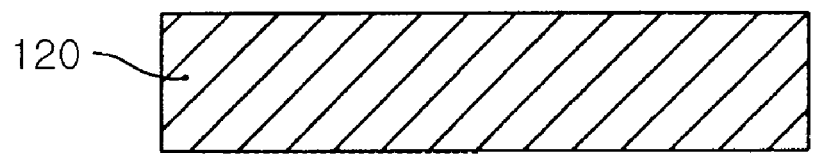
FIGS. 2A through 2D are cross-sectional views illustrating the process flow of forming a cavity in a cap wafer in a method for manufacturing a crystal resonator according to an exemplary embodiment of the present invention.
Figure 2B:
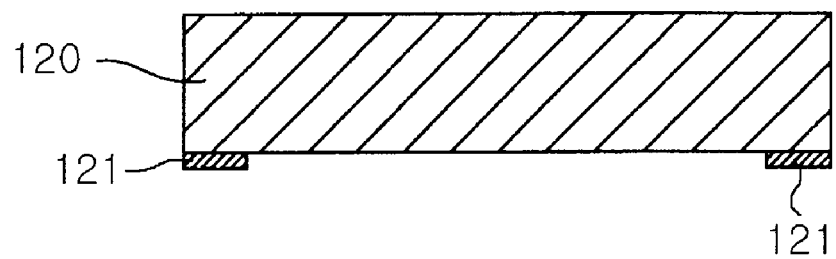
Figure 2C:
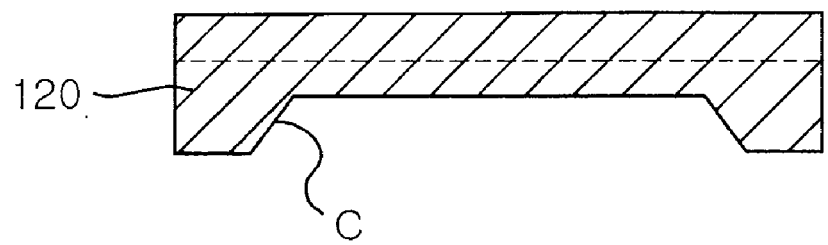
Figure 2D:
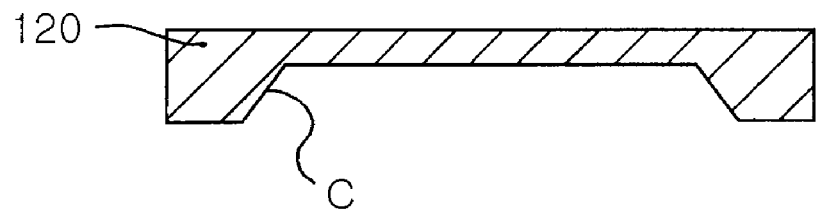

To form the cavity C which is open downward, as shown in FIGS. 2A, 4B and 2C, a protection mask 121 is formed on the bottom surface of the cap wafer 120. Thereafter, the bottom surface of the cap wafer 120 is etched by dry-etching such as sand blasting or wet-etching using an etching solution, thereby forming the cavity C.

After the cavity C is formed, a remaining portion of the protection mask 121 is removed from the bottom surface of the cap wafer 120 by ashing.

The protection mask 121 may be formed of photo resist or dry film resist. A metal mask may be used instead if a width of a desired pattern is wide.

As shown in FIG. 2C, a top surface of the cap wafer 120 may be polished up to a location indicated by a dotted line in the drawing in order to further reduce a thickness of a package.

Figure 3A:
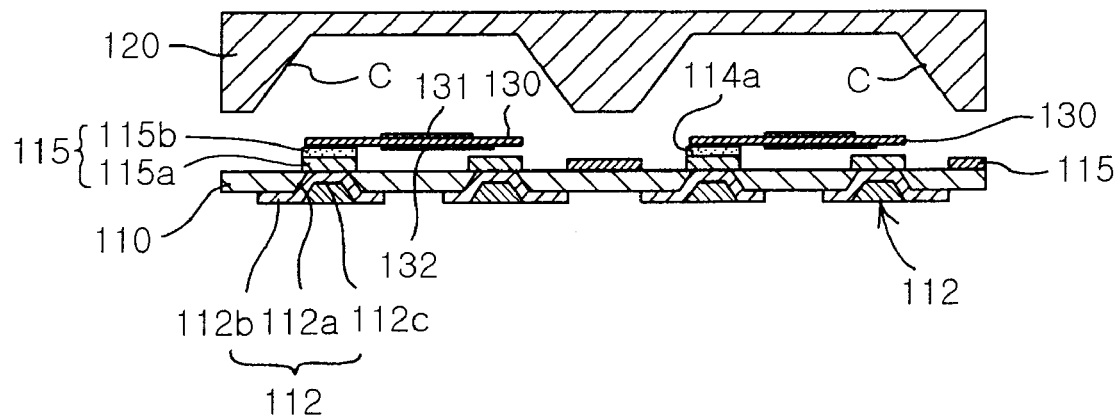
FIGS. 3A through 3C are cross-sectional views illustrating the process flow of bonding a cap wafer to a package wafer in a method for manufacturing a crystal resonator according to an exemplary embodiment of the present invention.
Figure 3B:
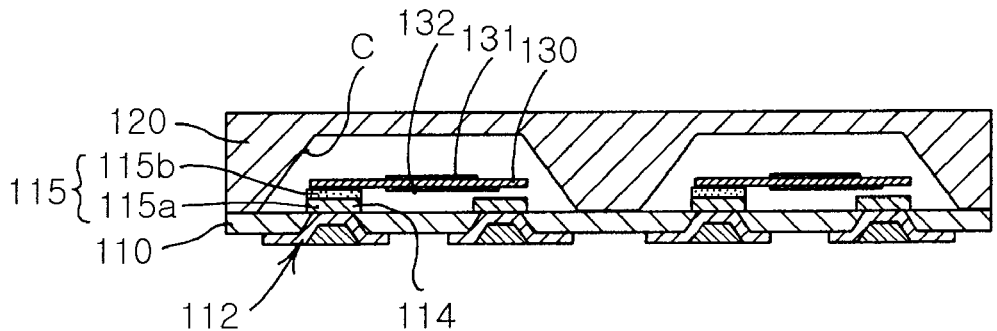
Figure 3C:
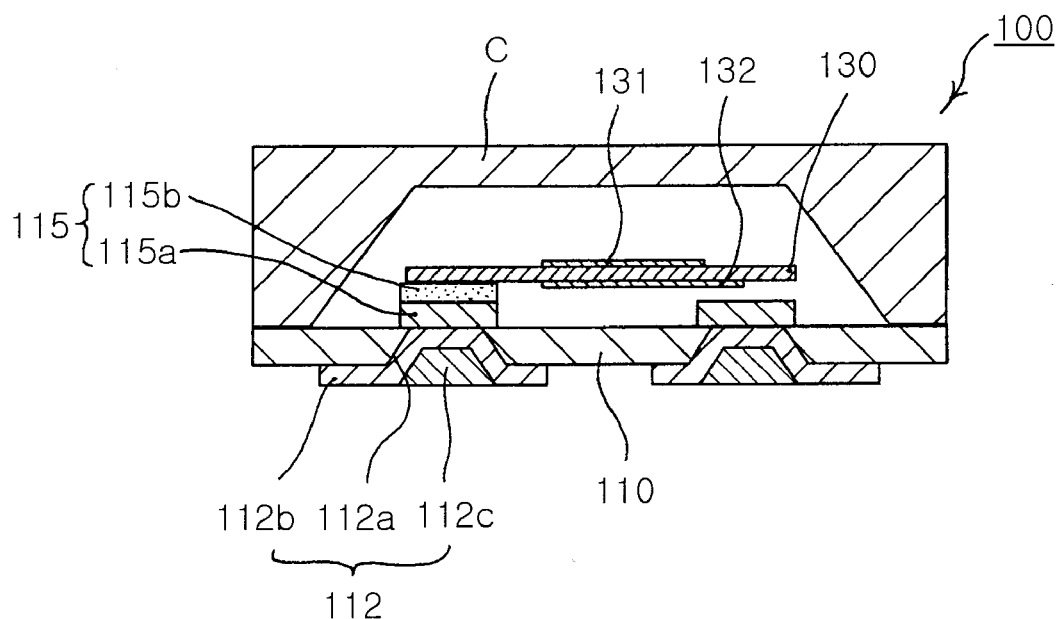

FIGS. 3A, 3B and 3C are cross-sectional views illustrating the process flow of bonding the cap wafer with the package wafer 110 in a method for manufacturing a crystal resonator according to an exemplary embodiment of the present invention.

To bond the package wafer 110 with the cap wafer 120, as shown in FIG. 3A, the package wafer 110 to which the crystal blank 130 mounted is disposed as a lower component, and the cap wafer 120 including the cavity C is disposed as an upper component. That is, the package wafer 110 is disposed under the cap wafer 120.

The cavity C formed in the bottom surface of the cap wafer 120 corresponds to the crystal blank 130. The bottom surface of the cap wafer 120 to be bonded (hereinafter, also referred to a bottom bonding surface) faces the top surface of the package wafer 110 to be bonded (hereinafter, also referred to as a top bonding surface).

In this state, as shown in FIG. 3B, the cap wafer 120 is placed on the package wafer 110. The crystal blank 130 is disposed in a space formed between the cavity C of the cap wafer 120 and the package wafer 110, and the top bonding surface of the package wafer 110 contacts the bottom bonding surface of the cap wafer 120.

The top and bottom bonding surfaces, when bonded together, become a continuous closed line surrounding the crystal blank 130.

Subsequently, if one of the cap wafer 110 and the package wafer 120 is a silicon wafer and the remaining one is a glass wafer, the silicon wafer is heated in the air or vacuum and the glass wafer is heated at a high voltage, so that the top bonding surface of the package wafer 110 is integrally bonded with the bottom bonding surface of the cap wafer 120.

Subsequently, when the top bonding surface of the package wafer 110 and the bottom bonding surface of the cap wafer 120 are integrally bonded by anodic bonding, a continuous sealing line is formed surrounding the crystal blank 130. Accordingly, the crystal blank 130 is completely isolated from the external environment.

After the anodic bonding of the package wafer 110 and the cap wafer 120, the top surface of the cap wafer 120 may be polished to reduce an entire thickness of a package.

Although it is described that the polishing of the top surface of the cap wafer 120 is performed after the package wafer 110 is bonded with the cap wafer 120, the present invention is not limited thereto. The top surface of the cap wafer 120 may be polished after the cavity C is formed in the bottom surface of the cap wafer 120.

As shown in FIG. 3C, a plurality of crystal resonators 110 maybe separately manufactured by cutting the bonded package and cap wafers 110 and 120 along a virtual line extending in a direction across a sealing line formed the bonding between the package wafer 110 and the cap wafer 120. Each individual crystal resonator 100 includes the package wafer 110 as a lower substrate, the cap wafer 120 including the cavity C as an upper substrate, and the crystal blank 130 mounted to the package wafer 110 and sealed by the anodic bonding between the package wafer 110 and the cap wafer 120.

For the anodic bonding between the package wafer 110 and the cap wafer 120, if the cap wafer 120 including the cavity C is formed of silicon, the package wafer 110 which includes the connection terminals 112 and to which crystal blank 130 is mounted is formed of glass.

Alternatively, if the cap wafer 120 including the cavity C is formed of glass, the package wafer 110 which includes the connection terminals 112 and to which the crystal blank 130 is mounted is formed of silicon. Accordingly, the package wafer 110 and the cap wafer 120 are anodically bonded. To insure an insulating property of the package wafer 110, a highly insulating wafer may be used, or the package wafer may be coated with an insulating layer and an electrode pattern for electrical connection with the connection terminal 112 may be formed.

According to the exemplary embodiments of the present invention, the cap wafer including the cavity which is open downward is placed on and bonded with a top surface of the package wafer, and then a bonded portion at which the package wafer and the cap wafer are bonded together is cut, thereby manufacturing a plurality of individual crystal resonators. Accordingly, by this wafer level packaging, a product size and thickness is reduced, thereby allowing the product to have a small size and a thin profile. Since the crystal resonators are mass produced, manufacturing costs can be saved. Also, the produce lead time and produce efficiency can be improved.

Also, a frequency of the crystal blank can be precisely adjusted in a wafer state during a packaging process, and a defect of the small and thin crystal resonator can be precisely inspected on the package wafer. Accordingly, precision and reliability of a product can be significantly improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for manufacturing a crystal resonator, the method comprising:
   providing a package wafer including a plurality of paired internal and external connection terminals, each internal and external connection terminal having top and bottom ends respectively exposed to top and bottom surfaces of the package wafer;
   forming a height control member on the top end of one internal and external connection terminal of each pair of internal and external connection terminals, and bonding a first end of a crystal blank, including an excitation electrode, on the height control member, whereby a second end of the crystal blank is disposed directly above the other internal and external connection terminal of the pair of internal and external connection terminals;

placing a bottom surface of a cap wafer having a cavity, which is open downward, on the top surface of the package wafer to which the crystal blank is mounted, and anodically bonding the package wafer with the cap wafer; and cutting the package wafer and the cap wafer in a direction across a bonding line formed by the bonding of the package wafer and the cap wafer to provide a plurality of crystal resonators that are individually separated.

2. The method of claim 1, wherein the providing the package wafer comprises:

forming a first pattern mask on the bottom surface of the package wafer and etching the bottom surface of the package wafer to form a plurality of blind via holes each having a closed upper end;

forming a second pattern mask surrounding the blind via holes, and applying a conductive metal layer in the blind via holes and the bottom surface of the package wafer; and polishing the top surface of the package wafer to expose a top end of each blind via hole outward.

3. The method of claim 2, wherein the applying a conductive metal layer comprises filling a conductive filler in an inner space of each blind via hole.

4. The method of claim 1, wherein the forming a height control member comprises:

forming a third pattern mask exposing the top end of the internal and external connection terminal on the top surface of the package wafer, and exposing, to light, the top end of the internal and external connection terminal exposed by the third mask pattern to form a plating pattern;

forming a first metal layer of a predetermined thickness on the plating pattern; and forming a second metal layer of a predetermined thickness on the first metal layer.

5. The method of claim 1, wherein the bonding one end of a crystal blank comprises applying conductive paste on a top end of the height control member.

6. The method of claim 1, wherein the height control member and the crystal blank are bonded with each other by an ultrasonic method.

7. The method of claim 1, wherein the excitation electrode formed on the top surface of the crystal blank is partially removed by dry-etching to adjust a frequency of the crystal blank.

8. The method of claim 1, further comprising polishing a top surface of the cap wafer to reduce a thickness of the cap wafer after the cavity is formed in the cap wafer.

9. The method of claim 1, further comprising polishing a top surface of the cap wafer to reduce a thickness of the cap wafer after the package wafer and the cap wafer are bonded with each other.

* * * * *